(12) United States Patent
Hirashita

(10) Patent No.: US 6,197,601 B1
(45) Date of Patent: Mar. 6, 2001

(54) METHOD OF CORRECTING TEMPERATURE OF SEMICONDUCTOR SUBSTRATE

(75) Inventor: Norio Hirashita, Tokyo (JP)

(73) Assignee: OKI Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/427,085

(22) Filed: Oct. 26, 1999

(30) Foreign Application Priority Data

Oct. 30, 1998 (JP) ................................... 10-310537

(51) Int. Cl.[7] ....................................................... H01L 21/00
(52) U.S. Cl. .................. 438/5; 438/8; 438/800; 438/14
(58) Field of Search .................................. 438/5, 7, 6, 8, 438/800, 14, 16

(56) References Cited

U.S. PATENT DOCUMENTS 5,989,763 * 5/1998 Bendik et al. ..................... 430/30

OTHER PUBLICATIONS

Abstract "CALIBRATION METHOD AND DEVICE OF PYROMETER", Tanaka Hiroyuki; Publication No. 11160166 A, Jun. 18, 1999; OKI ELECTRIC CO., LTD.

* cited by examiner

Primary Examiner—Charles Bowers
Assistant Examiner—Craig Thompson
(74) Attorney, Agent, or Firm—Rabin & Champagne, P.C.

(57) ABSTRACT

In a semiconductor manufacturing apparatus, a semiconductor substrate ion-implanted with an ion species is heated and thereby raised in temperature under vacuum. At this time, a partial pressure of a gas released from the semiconductor substrate is measured by a quadrupole mass spectrometer. Further, a change in partial pressure with time is observed and compared with a pre-measured release characteristic, whereby the temperature of the semiconductor substrate is corrected.

13 Claims, 3 Drawing Sheets

METHOD OF CORRECTING TEMPERATURE OF SEMICONDUCTOR SUBSTRATE

BACKGROUND OF THE INVENTION

1. Field of the Invention

This invention relates to a method of correcting the temperature of a semiconductor substrate, which is suitable for use during manufacture of a semiconductor integrated circuit device in a semiconductor manufacturing apparatus.

2. Description of the Related Art

A method of manufacturing a semiconductor integrated circuit device is not capable of directly measuring or controlling the temperature of a semiconductor wafer substrate during a manufacturing process. The temperature of the semiconductor wafer substrate is normally measured or controlled by a thermocouple placed in the vicinity of the semiconductor substrate. This temperature is generally different from an accurate substrate temperature and thus corrected by using, for example, a thermocouple embedded in the substrate. In a manufacturing process in a vacuum atmosphere, even in an operation for manufacturing a semiconductor integrated circuit, the difference between a reference temperature and the substrate temperature, used for process control, shows a tendency to greatly vary depending on variation in the structure of equipment, e.g., the thermal capacity of a wafer stage or the like in which a substrate and a reference thermocouple are embedded, the degree of adhesion between the two or the emissivity of the substrate or the like.

It is further known in a so-called cold wall-type manufacturing apparatus wherein the temperature around a substrate is low as compared with these temperatures, that a reduction in temperature due to thermal radiation from the substrate greatly depends on the temperature of a peripheral portion of the substrate so that the substrate temperature changes. Many techniques such as a chemical vapor deposition (CVD) method and a physical vapor deposition (PVD) method employed in the process of manufacturing the semiconductor integrated circuit device involve such a problem. These techniques show a problem in that thermal environments of the thermal capacity of the substrate's peripheral portion, etc. vary depending on their process throughput and differ from each other depending on between respective apparatuses or equipment. It is thus necessary to simply evaluate and manage the dependence on the process throughput and the difference between the respective apparatuses.

However, a problem arises in that since it is not easy from the viewpoint of the equipment to place the substrate with the thermocouple embedded therein in a predetermined wafer processing position, take out or extract a feedthrough of the thermocouple into the air from inside the manufacturing process equipment in the atmosphere under the reduced pressure and thereby measure the temperature of the substrate, the dependence on the process throughput and the equipment-to-equipment difference cannot be sufficiently grasped and managed. Therefore, this has caused a problem that the reliability of the process and process compatibility between the respective apparatuses are not sufficiently ensured.

Due to the differences in thermal conductivity and emissivity, the temperatures of the surfaces of an insulating film and a metal thin film formed over the semiconductor wafer substrate do not necessarily coincide with the temperature of the wafer substrate. A problem arises in that since the surface temperature of the substrate varies depending on a multilayer structure of the semiconductor integrated circuit device even in the same manufacturing process, process conditions change.

SUMMARY OF THE INVENTION

In order to solve these problems, the present invention is provided wherein a semiconductor wafer substrate, in which a gas species is ion-implanted in a film formed therein or thereon, is placed in a manufacturing process apparatus that desires to correct the temperature thereof or measure the dependence of the temperature on process throughput, and a process set temperature or the time between the beginning of heating and the release of the gas species is measured from a release characteristic of the gas species released when the semiconductor wafer substrate is held under vacuum, whereby the temperature of the semiconductor substrate can be corrected based on the measurement result.

Further, another invention is provided wherein a gas released upon a phase transition of a silicide layer formed over a semiconductor substrate, or from the semiconductor substrate or upon alloy forming reaction produced on the semiconductor substrate is measured, thereby permitting correction of the temperature of the semiconductor substrate based on the result of the measurement.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particulary pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
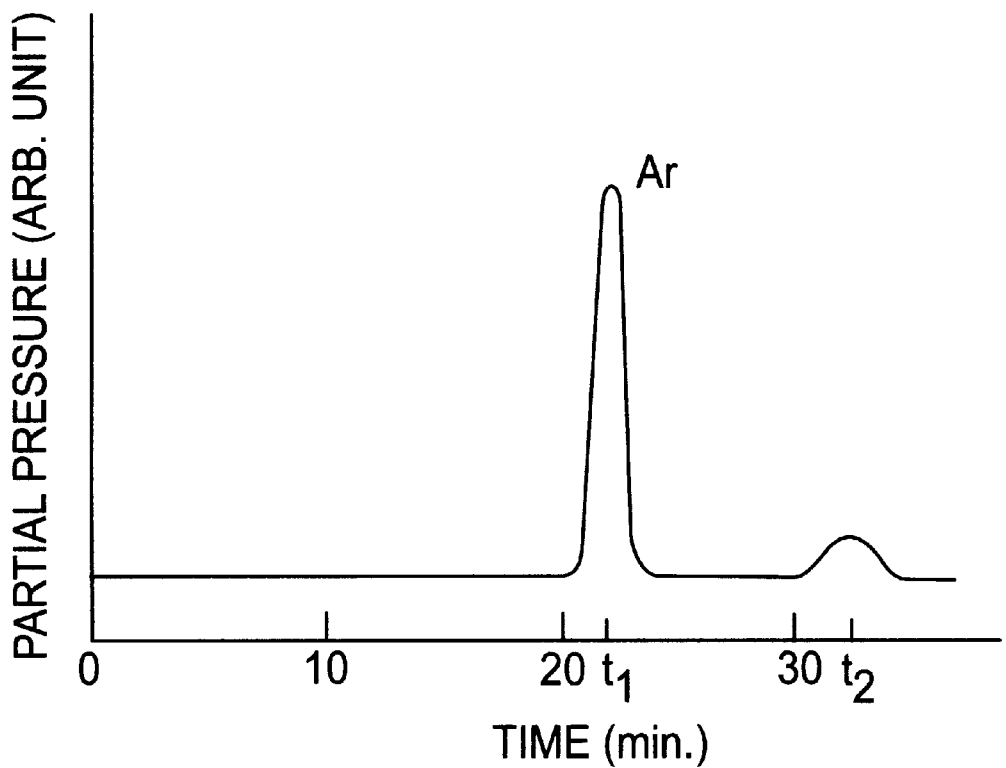
FIG. 1 is a diagram showing a first embodiment of the present invention and shows the dependence of a partial pressure of an Ar release gas on a temperature rise time at the time that a silicon substrate ion-implanted with an Ar ion is heated so as to raise the temperature thereof.

Results obtained by placing a silicon wafer substrate ion-implanted with argon (Ar), within a piece of semiconductor manufacturing equipment or apparatus, measuring a partial pressure of Ar lying within the semiconductor manufacturing apparatus by a quadrupole mass spectrometer when the temperature of the silicon wafer substrate is raised at 30° C. per minute under vacuum, and plotting changes in partial pressure as a function of time, are shown in FIG. 1 as a first embodiment. It is recognized that clear peaks appear in Ar partial pressure at time t1 (23 minutes later) and time t2 (33 minutes later) since the rise in temperature is started. In general, the partial pressure indicates a release peak proportional to a reaction rate describable as the product of a velocity or rate constant of a release reaction and a function dependent on the concentration. In the present embodiment, a silicon substrate is used wherein Ar having a dose of $2 \times 10^{15}/cm^2$ is ion-implanted at an acceleration energy of 60 keV through a silicon oxide film having a thickness of 2 nm.

Figure 2:
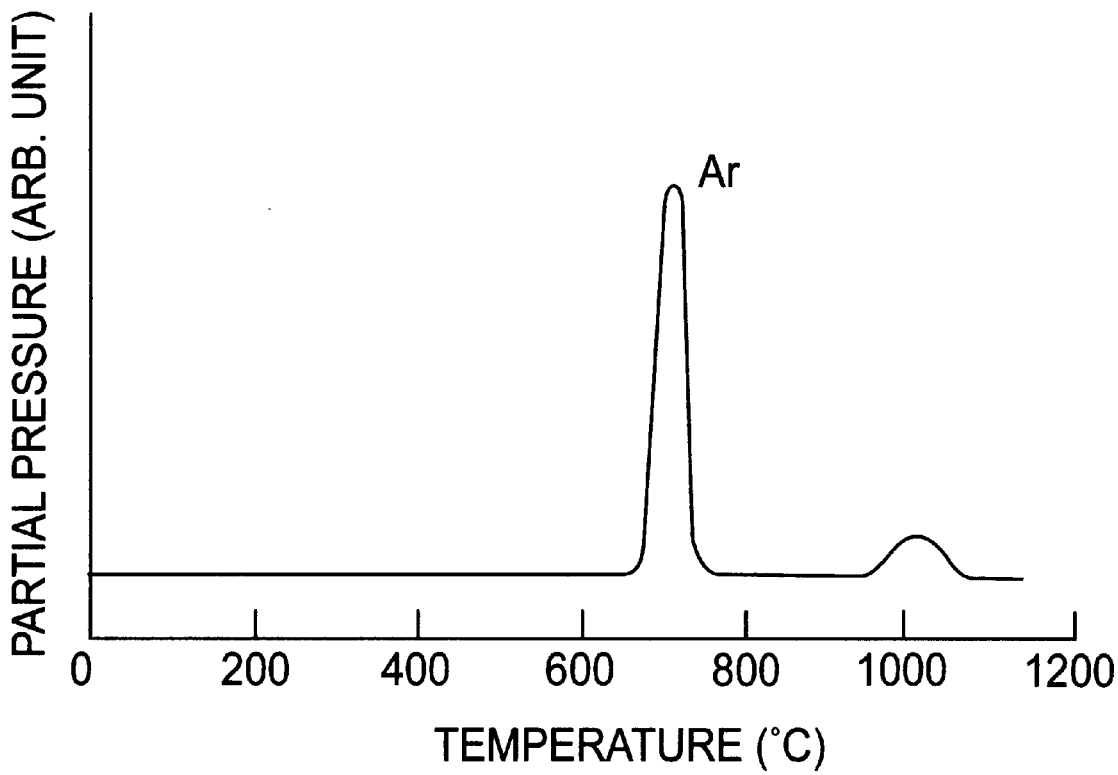
FIG. 2 shows the dependence of a partial pressure of an Ar release gas on the temperature at the time that the silicon substrate ion-implanted with the Ar ion is heated so as to raise the temperature thereof.

An initial release on the low-temperature side is considered to be a release incident to solid-phase crystallization of amorphous silicon formed by ion-implantation. The next release on the high-temperature side is estimated to result from the ejection of Ar constrained or trapped by failures or defects from silicon crystalline according to the recovery of residual defects. While respective release peak temperatures depend on the temperature of the wafer substrate itself, the velocity or rate of a rise in temperature, and the depth and amount of an ion implantation, release peaks are shown at times corresponding to about 710° C. and about 1010° C. as shown in FIG. 2, judging from an analysis using a programmed-temperature release gas analyzing method.

Since these temperatures and times are decided according to a physical phenomenon inherent in a material, they are determined depending on the temperature of the wafer substrate itself and its rate of temperature rise. Actually, available manufacturing equipment makes it unnecessary to heat the substrate, i.e., raise the temperature of the substrate at a rate constant to the time and provides a temperature rise characteristic having time dependency inherent in the equipment. However, the corresponding substrate is introduced into the actual manufacturing equipment or apparatus and a gas species released upon heating of the substrate is measured by the quadrupole mass spectrometer or the like, whereby the temperature of the substrate can be corrected based on, for example, a reference temperature and time inherent in the equipment, at which the maximum value of the partial pressure is given.

It is revealed that an inert gas or inert gas species ion-implanted in a metal, is trapped by a lattice defect introduced upon ion implantation and released outside a solid owing to the recovery process of a defect at heating. It is recognized that a complex composed of a plurality of inert gas species and a point defect is formed within the solid and the inert gas is released at different temperatures according to a difference in activation energy necessary for the disappearance or quenching thereof. Thus, an inert gas species is ion-implanted in a metal thin film formed over the semiconductor substrate and released upon a rise in temperature thereof under heat thereby to measure the gas species, whereby the temperature of the substrate can be corrected.

If the ion species employed in the present embodiment is an inert species such as H, He, Ne, Kr, Xe, Rn or the like, even in the case of ions other than Ar, then similar effects can be obtained.

Figure 3:
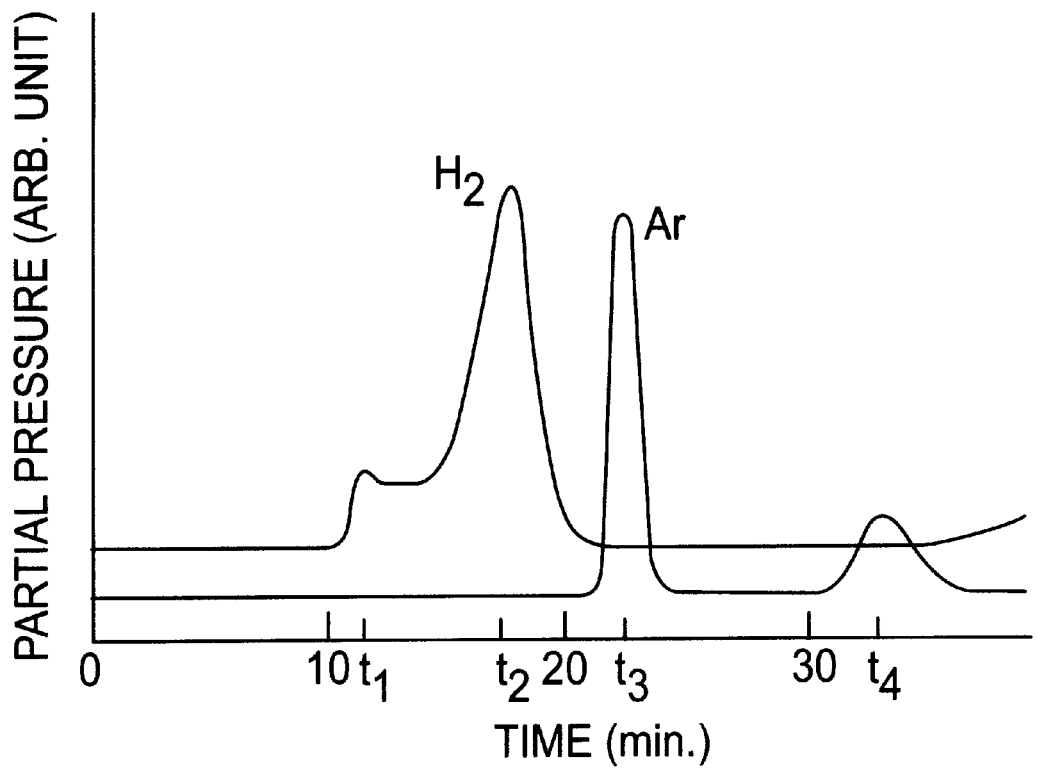
FIG. 3 is a diagram showing a second embodiment of the present invention and shows the dependence of partial pressures of Ar and H2 release gases on a temperature rise time at the time that a silicon substrate ion-implanted with Ar and H ions is heated so as to raise the temperature thereof.

Results obtained by placing a silicon wafer substrate, ion-implanted with Ar and hydrogen (H), within a semiconductor manufacturing apparatus, measuring partial pressures of Ar and $H_2$ lying within the semiconductor manufacturing apparatus by the quadrupole mass spectrometer when the temperature of the silicon wafer substrate is raised at 30° C. per minute under vacuum, and plotting changes in partial pressure as a function of time, are shown in FIG. 3 as a second embodiment. It is recognized that the peaks of an $H_2$ partial pressure and the peaks of an Ar partial pressure respectively appear at time t1 (12 minutes later), and time t2 (18 minutes later) and at time t3 (23 minutes later), and time t4 (33 minutes later) since the rise in temperature is started. In the present embodiment, a silicon substrate is used wherein Ar having a dose of $5 \times 10^{15}/cm^2$ dose of Ar ions and a $1 \times 10^{16}/cm^2$ dose of H ions are respectively implanted therein at an acceleration energy of 100 keV and an acceleration energy of 40 keV through a silicon oxide film having a thickness of 2 nm. While the details of an $H^2$ elimination or release mechanism are yet unknown, an Ar release mechanism is considered to be similar to the one referred to above. While respective release peak temperatures depend on the temperature of the wafer substrate itself, the rate of a rise in temperature, and the depth and amount of ion implantation, $H^2$ exhibits release peaks at times corresponding to about 360° C. and about 550° C. and Ar shows release peaks at times corresponding to about 700° C. and abut 1000° C. judging from an analysis using the programmed-temperature release gas analyzing method.

Since these temperatures and times are decided according to a physical phenomenon inherent in a material, they are determined depending on the temperature of the wafer substrate itself and its rate of temperature. Thus, the corresponding substrate is introduced into an actual manufacturing apparatus, and a gas species released upon heating of the substrate is measured by the quadrupole mass spectrometer or the like, whereby the temperature of the substrate can be corrected based on, for example, a reference temperature and time inherent in the apparatus, at which the maximum value of the partial pressure is given.

Figure 4:
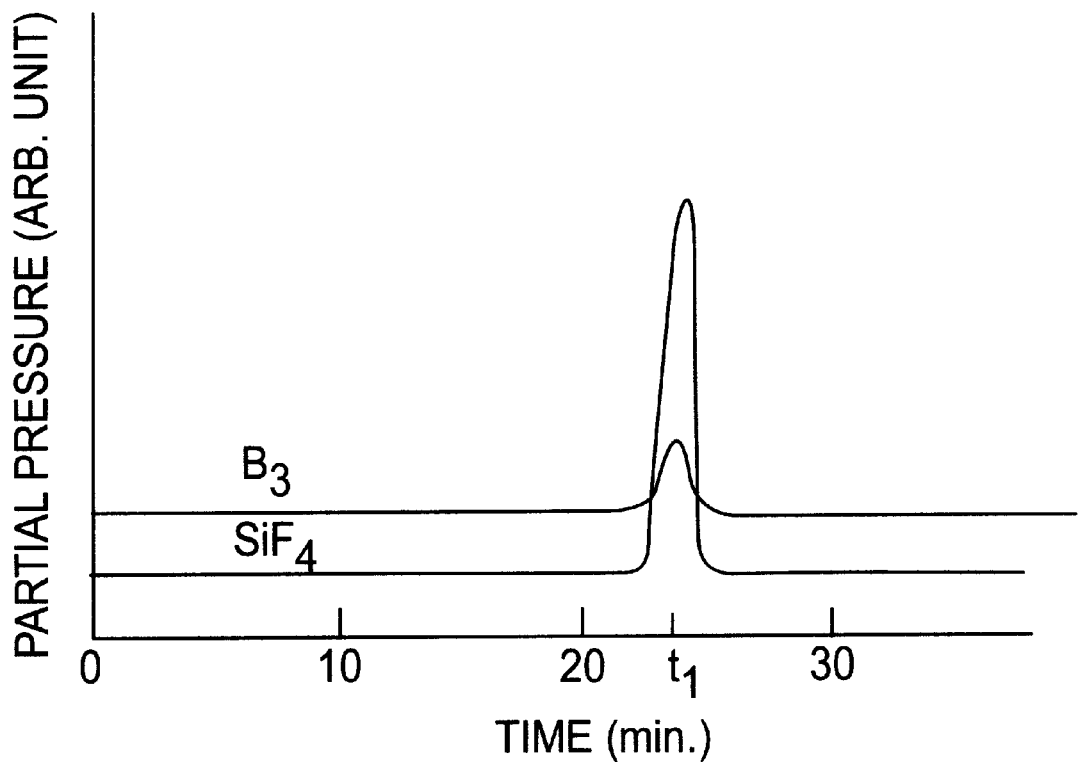
FIG. 4 is a diagram illustrating a third embodiment of the present invention and shows the dependence of partial pressures of $SiF_4$ and $B_3$ release gases on a temperature rise time at the time that a silicon substrate ion-implanted with a $BF_2$ ion is heated so as to raise the temperature thereof.

Results obtained by placing a silicon wafer substrate ion-implanted with $BF_2$ within a semiconductor manufacturing apparatus, measuring partial pressures of $SiF_4$ and $B_3$ lying within the semiconductor manufacturing equipment by the quadrupole mass spectrometer when the temperature of the silicon wafer substrate is raised at 30° C. per minute under vacuum, and plotting changes in partial pressure as a function of time, are shown in FIG. 4 as a third embodiment. It is recognized that the peaks of both partial pressures appear at time t1 (22 minutes later) since the rise in temperature is started. In the present embodiment, a silicon wafer substrate is used wherein $5 \times 10^{15}/cm^2$ dose of $BF_2$ ions is implanted therein at an acceleration energy of 60 keV through a silicon oxide film having a thickness of 20 nm. An oxide film provided on the surface of the silicon wafer substrate is removed by a solution of hydrofluoric acid, immediately before the introduction of the manufacturing equipment by which one desires to measure temperatures.

With solid-phase crystallization, $SiF_4$ and $B_3$ high in vapor pressure exhibit release peaks at about 700° C. The temperature of the wafer substrate can be monitored and corrected according to this temperature or the time that has elapsed since the rise in temperature is started. In the present embodiment, the partial pressures of the release gases are sufficiently low, and can be measured with high sensitivity even in the case of manufacturing equipment that is poor in the degree of vacuum. It is thus possible to correct the temperature of the substrate.

If the ion species employed in the present embodiment are group III impurity elements such as B, BF, Ga and In, or compounds thereof even in the case of those other than $BF_2$, then similar effects can be obtained. The ion species may be group V impurity elements such as P, As and Sb.

Figure 5:
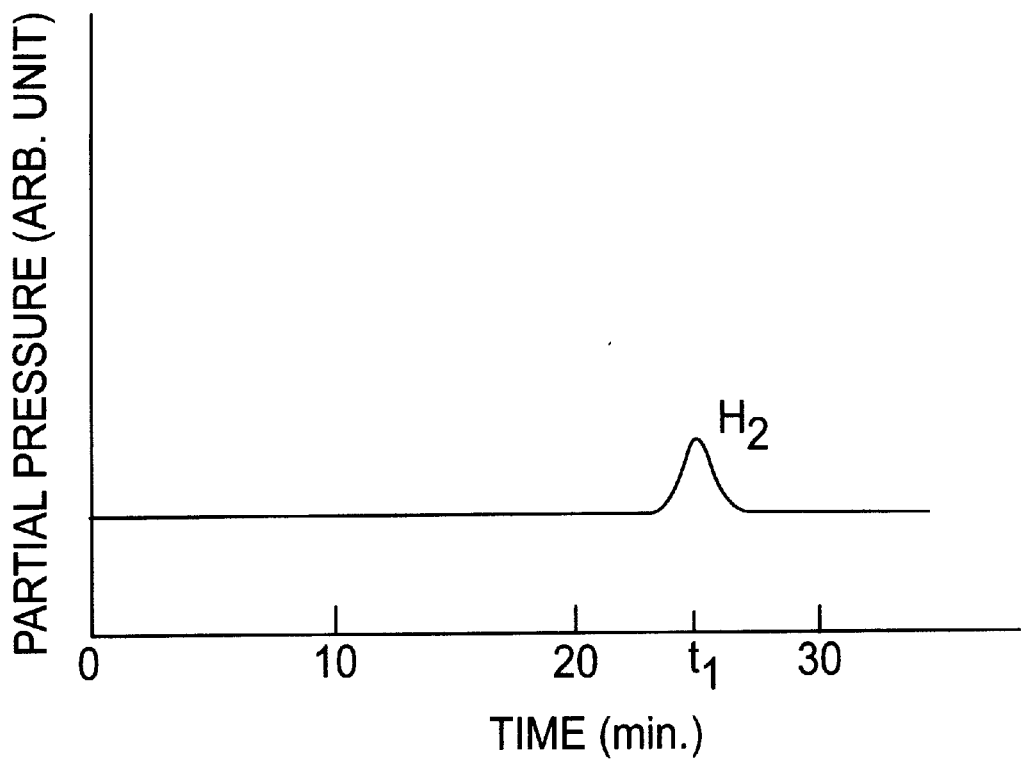
FIG. 5 is a diagram showing a fourth embodiment of the present invention and depicts the dependence of a partial pressure of an H2 release gas on a temperature rise time at the time that titanium silicide provided over a silicon substrate is heated so as to raise the temperature thereof.

Results obtained by measuring an $H_2$ release characteristic incident to the phase transition of a titanium silicide ($TiSi_2$) thin film formed over a silicon wafer substrate from a C49 phase, to a C54 phase are shown in FIG. 5 as a fourth embodiment. It was found out that an impurity H contained in the $TiSi_2$ thin film was released with a crystal structure phase transition developed at about 750° C. By using it, the temperature of the substrate can be corrected by means of the $TiSi_2$ thin film formed over the wafer substrate.

Further, a metal layer of aluminum form and gold (Au) is formed over the silicon wafer substrate. The release of impurities contained in the metal layer upon alloyed reaction with the silicon substrate, is expected to occur at their eutectic temperatures of about 577° C. and 370° C. Thus, the temperature of the substrate can be corrected by using this phenomenon. Alternatively, an effect similar to the above can be obtained even in the case of a layer of silver (Ag).

Figure 6:
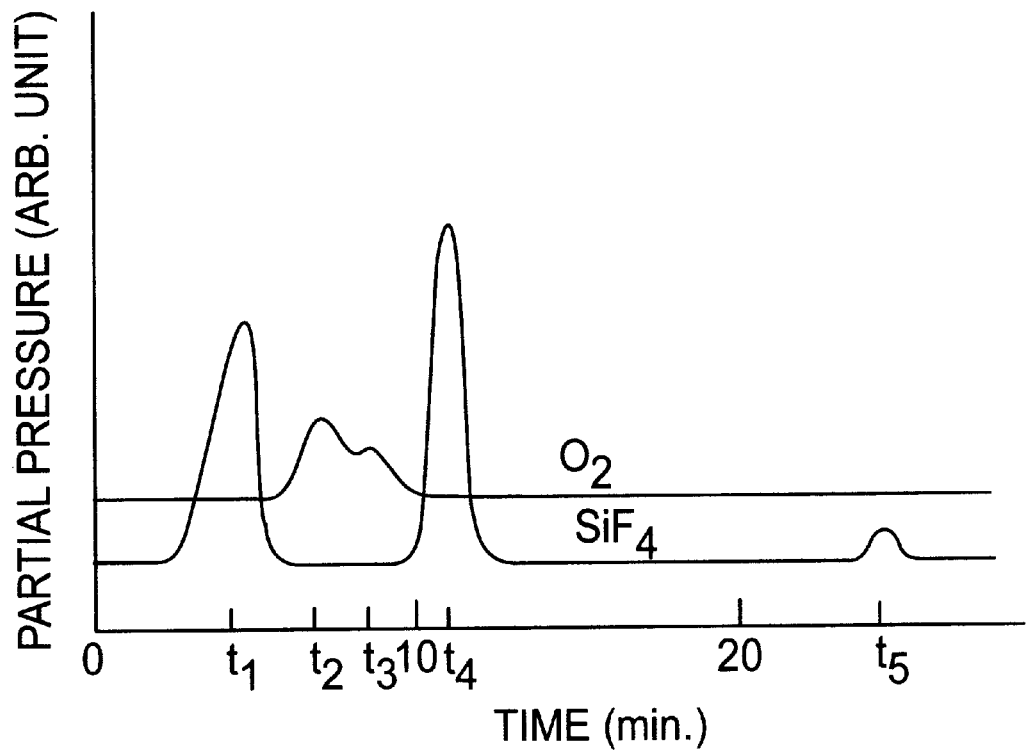
FIG. 6 is a diagram showing a fifth embodiment of the present invention and shows the dependence of a partial pressure of an H2 release gas on a temperature rise time at the time that an F ion is ion-implanted in a silicon oxide film on a silicon substrate and the silicon oxide film is heated so as to rise the temperature thereof.

Results obtained by ion-implanting fluorine (F) in a thermal oxide film on a silicon wafer substrate, placing the silicon wafer substrate within semiconductor manufacturing equipment, measuring a partial pressure of an oxygen gas ($O_2$) lying within the semiconductor manufacturing equipment by the quadrupole mass spectrometer when the temperature of the silicon wafer substrate is raised at 30° C. per minute under vacuum, and plotting changes in partial pressure as a function of time, are shown in FIG. 6 as a fifth embodiment. It is recognized that the peaks of an $SiF_4$ partial pressure appear at time t1 (5 minutes later), time t4 (13 minutes later) and time t5 (26 minutes later) and the peaks of an $O_2$ partial pressure appear at time t2 (7 minutes later) and time t3 (nine minutes later) since the rise in temperature is started, respectively. In the present embodiment, a silicon wafer substrate is used wherein a 1×1015/cm2 is dose of F ions implanted in a thermal silicon oxide film having a thickness of 700 nm at an acceleration energy of 15 keV. It is necessary to remove a surface layer extending to a radiation range of ion-implantation, by hydrofluoric acid or the like for the purpose of obtaining such release characteristics.

While a detailed release reaction mechanism is unknown, three processes exist wherein the ion-implanted F reacts with $SiO_2$ of the mother body to thereby form $SiF_4$ high in vapor pressure. The release of $O_2$ is estimated to be a release of an $O_2$ molecules and peroxoradical formed by ion impact. In either case, these separation temperatures are already determined physico-chemically, and the peak temperatures are determined depending on the temperature of the surface of the oxide film and its rate of temperature rise. Therefore, the temperature of the substrate can be corrected based on the aforementioned changes in partial pressure inside the equipment.

According to the above-described method of correcting the temperature of the semiconductor substrate, an advantageous effect can be brought about in that the temperature of a semiconductor substrate itself in semiconductor equipment, can be measured with ease and accuracy and the dependence of the temperature of the semiconductor substrate on the process throughput and an equipment-to-equipment difference, can be measured and managed as a temperature difference in the semiconductor substrate without variations being developed due to individual difference between built-in thermocouples and the like.

A wide range of correction of the temperature of the semiconductor substrate can be also performed by utilizing the above-described approaches in combination.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of correcting the temperature of a semiconductor substrate, which is suitable for use during a process of manufacturing a semiconductor device in semiconductor manufacturing equipment, the method comprising the steps of:

heating the semiconductor substrate under vacuum so as to increase the temperature thereof, said semiconductor substrate containing an ion species different from another ion species known to have been introduced by ion implantation;

measuring a gas released from said semiconductor substrate;

comparing the result of measurement with a pre-measured release characteristic; and correcting the temperature of said semiconductor substrate according to a result of the comparison.

2. The method according to claim 1, wherein said semiconductor substrate is a silicon substrate.

3. The method according to claim 2, wherein said ion species is one or more inert gas species selected from among Ar, H, He, Ne, Kr, Xe and Rn.

4. The method according to claim 2, wherein said ion species is selected from the group consisting of group III impurity elements and compounds thereof.

5. The method according to claim 4, wherein said group III impurity elements and compounds thereof consist of B, BF, BF2, Ga and In.

6. The method according to claim 2, wherein said ion species is selected from the group consisting of group V impurity elements or compounds thereof.

7. The method according to claim 6, wherein said group V impurity elements consists of P, As and Sb.

8. A method of correcting the temperature of a semiconductor substrate, which is suitable for use during a process of manufacturing a semiconductor device in semiconductor manufacturing equipment, comprising the steps of:

heating the semiconductor substrate under vacuum so as to increase the temperature thereof, said semiconductor substrate containing an ion species introduced by ion implantation in a metal layer formed over the semiconductor substrate;

measuring a gas released from said semiconductor substrate;

comparing the measuring result with a pre-measured releas characteristic; and correcting the temperature of said semiconductor substrate according to a result of the comparison.

9. A method of correcting the temperature of a semiconductor substrate, which is suitable for use during a process of manufacturing a semiconductor device in semiconductor manufacturing equipment, comprising the steps of:

heating the semiconductor substrate under vacuum so as to increase the temperature thereof, said semiconductor substrate having formed thereon a titanium silicide layer having a C49 crystal structure;

measuring a gas released when said titanium silicide layer is phase-transitioned to a C54 crystal structure;

comparing the measuring result with a pre-measured release characteristic; and correcting the temperature of said semiconductor substrate according to a result of the comparison.

10. A method of correcting the temperature of a semiconductor substrate, which is suitable for use during a process of manufacturing a semiconductor device in semiconductor manufacturing equipment, comprising the steps of:

heating the semiconductor substrate under vacuum so as to increase the temperature thereof, said semiconductor substrate having formed thereon a metal layer that reacts with the semiconductor substrate;

measuring a gas released when said metal layer reacts with the semiconductor substrate for alloy formation;

comparing the measuring result with a pre-measured release characteristic; and correcting the temperature of said semiconductor substrate according to a result of the comparison.

11. A method of correcting the temperature of a semiconductor substrate, which is suitable for use during a process of manufacturing a semiconductor device in semiconductor manufacturing equipment, comprising the steps of:

forming a silicon oxide film on the semiconductor substrate;

implanting F ions into the silicon oxide film;

heating the semiconductor substrate with the F ion under vacuum implanted silicon oxide film formed thereon, so as to increase the temperature thereof;

measuring a gas released from said semiconductor substrate;

comparing the measuring result with a pre-measured release characteristic; and correcting the temperature of said semiconductor substrate according to a result of the comparison.

12. A method of correcting the temperature of a semiconductor substrate, which is suitable for use in semiconductor manufacturing equipment, comprising the following steps of:

heating the semiconductor substrate and increasing the temperature thereof under vacuum, said semiconductor substrate having an F ion introduced by ion implantation in a silicon oxide film formed thereon;

measuring a gas released from said semiconductor substrate;

comparing the measured result with a pre-measured release characteristic; and thereby correcting the temperature of said semiconductor substrate.

13. The method according to claim 12, wherein said semiconductor substrate is a silicon substrate.

* * * * *